(12) United States Patent
Kushitani et al.

(10) Patent No.: US 6,917,258 B2
(45) Date of Patent: Jul. 12, 2005

(54) HIGH FREQUENCY SWITCH

(75) Inventors: Hiroshi Kushitani, Osaka (JP); Yasushi Nagata, Kyoto (JP); Takeo Yasuho, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/684,767

(22) Filed: Oct. 14, 2003

(65) Prior Publication Data
US 2004/0121752 A1 Jun. 24, 2004

(30) Foreign Application Priority Data
Oct. 24, 2002 (JP) ......................... 2002-309342

(51) Int. Cl.[7] .............. H01P 1/15; H04B 1/44; H03B 9/72
(52) U.S. Cl. ............... 333/103; 333/104; 333/126; 333/133; 455/83
(58) Field of Search ................. 333/103, 104, 333/126, 129, 132, 133; 455/83

(56) References Cited

U.S. PATENT DOCUMENTS

| | | | | |
|---|---|---|---|---|
| 4,677,688 A | * | 6/1987 | Yoshihara et al. ............ 455/82 |
| 5,499,000 A | * | 3/1996 | Morikawa et al. ............ 333/104 |
| 5,634,200 A | * | 5/1997 | Kitakubo et al. ............. 455/82 |
| 5,783,976 A | * | 7/1998 | Furutani et al. ............. 333/134 |
| 6,060,960 A | * | 5/2000 | Tanaka et al. ............... 333/104 |
| 6,456,172 B1 | * | 9/2002 | Ishizaki et al. ............. 333/133 |
| 6,472,953 B1 | * | 10/2002 | Sakuragawa et al. ....... 333/133 |
| 6,483,399 B1 | * | 11/2002 | Atokawa ..................... 333/133 |
| 6,563,396 B2 | * | 5/2003 | Tanaka et al. ............... 333/133 |
| 6,766,149 B1 | * | 7/2004 | Hikita et al. ................. 455/83 |

FOREIGN PATENT DOCUMENTS

| JP | 08-097743 | 4/1996 |
|---|---|---|
| JP | 09-181588 | 7/1997 |

* cited by examiner

*Primary Examiner*—Barbara Summons
(74) *Attorney, Agent, or Firm*—RatnerPrestia

(57) ABSTRACT

A high frequency switch configured particularly with FET switches. One end of second FET switch is connected between I/O port and reception port and the other end is ground. A parallel unit of strip line and capacitor is connected between second FET switch and I/O port. This parallel unit has the electrical length equivalent to ¼ wavelength of the high frequency signal input from transmission port.

9 Claims, 3 Drawing Sheets

HIGH FREQUENCY SWITCH

BACKGROUND OF THE INVENTION

1. Field of the Invention

The present invention relates to high frequency switches typically used in the RF circuits of mobile phones.

2. Background Art

A known structure of a high frequency switch used in an RF circuit of high frequency wireless apparatuses such as mobile phones is to mount a PIN diode on a multilayer board with a built-in strip line. (For example, refer to Japanese Laid-open Patent No. H8-97743 (pp. 3–4, FIGS. 1, 2, and 3).)

Ever greater integration of the high frequency switch and other high frequency components such as high frequency filters and amplifiers disposed around the high frequency switch is being seen. To allow integration, high frequency switches mounted on the multilayer board need to be downsized to secure extra space for mounting other high frequency components. One currently proposed method for downsizing high frequency switches using a PIN diode is the use of a field-effect transistor switch (FET switch) as a high frequency switch. (For example, refer to Japanese Laid-open Patent No. H9-181588 (p. 4, FIG. 1).)

However, if FET switches are employed, each FET switch needs to contain multi-step FETs, such as four- to eight-step FETs, taking into account the withstand voltage of FETs configuring the FET switch for high frequency signals input from a transmission port. This hinders sufficient downsizing of the high frequency switch and blocks integration.

SUMMARY OF THE INVENTION

The present invention offers a high frequency switch which includes a first FET switch connected between an input/output (I/O) port and a transmission port, a second FET switch whose one end is connected between the I/O port and reception port and the other end is grounded, a control port controlling ON and OFF of the first and second FET switches, and a parallel unit of a strip line and capacitor. The electrical length of this parallel unit connected between one end of the second FET switch and I/O port is equivalent to about ¼ wavelength of the high frequency signal input from the transmission port.

DETAILED DESCRIPTION OF THE INVENTION

Exemplary embodiments of the present invention are described below with reference to the drawings.

First Exemplary Embodiment

Figure 1A:
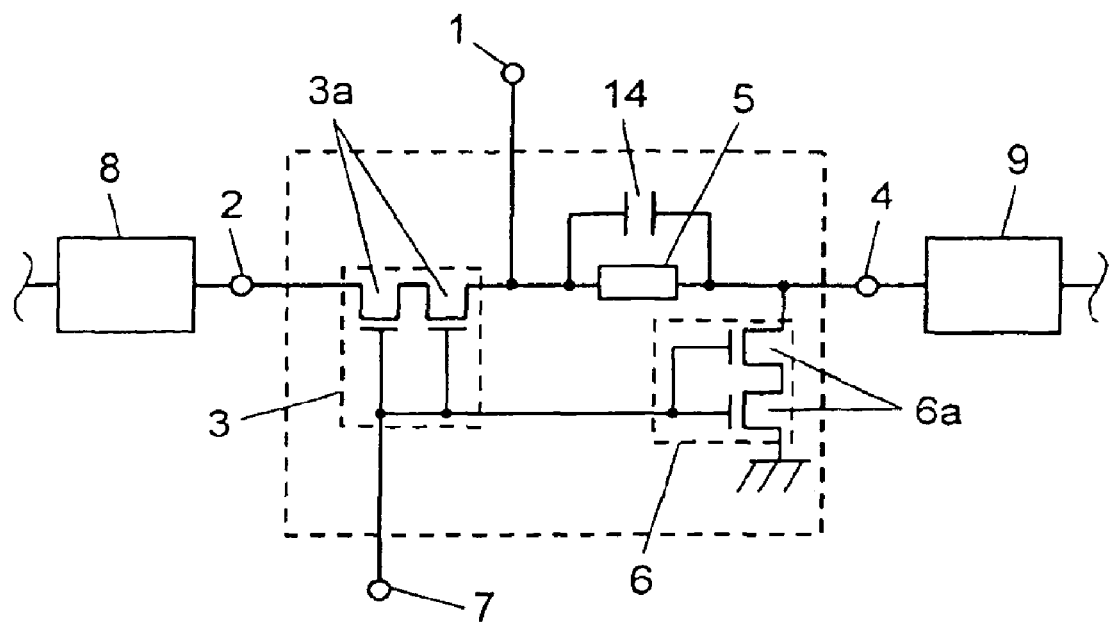
FIGS. 1A and 1B are equivalent circuit diagrams of a high frequency switch in accordance with a first exemplary embodiment of the present invention.

FIG. 1A is a circuit diagram of a high frequency switch employed in an RF circuit of a mobile phone. This high frequency switch basically includes first field-effect transistor switch (FET switch) 3 connected between input/output (I/O) port 1 and transmission port 2, strip line 5 connected between I/O port 1 and reception port 4, second field-effect transistor switch (FET switch) 6 connected between strip line 5 to the side of reception port 4 and a ground, and control port 7 which controls ON and OFF of the above two FET switches 3 and 6.

During transmission, a control voltage is applied from control port 7 to two FET switches 3 and 6 so as to turn on two FET switches 3 and 6. The electrical length of strip line 5 is set to about ¼ wavelength of the transmission signal so as to ground strip line 5 via second FET switch 6. This keeps the side of reception port 4, as seen from I/O port 1, open, allowing transmission signals input from transmission port 2 to flow efficiently to I/O port 1.

During receiving, two FET switches 3 and 6 are turned off by cutting the control voltage applied to these two FET switches 3 and 6. This makes the receiving signal input from I/O port 1 flow efficiently to reception port 4.

Taking into account the withstand voltage of the two FET switches 3 and 6, FET elements 3a and 6a configuring FET switches 3 and 6 need to have multiple steps such as a four- to eight-step structure, since the transmission signal is generally amplified via an amplifier (not illustrated) disposed before transmission port 2. However, FET elements 3a and 6a of the high frequency switch of the present invention require only a two-step structure.

This is achieved by providing strip line 5 and capacitor 14 inside the high frequency switch. Since a phase shifter becomes high impedance at radio frequencies as a result of configuring the phase shifter with a parallel unit of strip line 5 and capacitor 14, the voltage applied to each of the FET switches 3 and 6 is reduced. Accordingly, the number of steps in FET elements 3a and 6a respectively can be reduced.

The reduced number of steps in FET elements 3a and 6a greatly contributes to integration of the high frequency switch.

Figure 2:
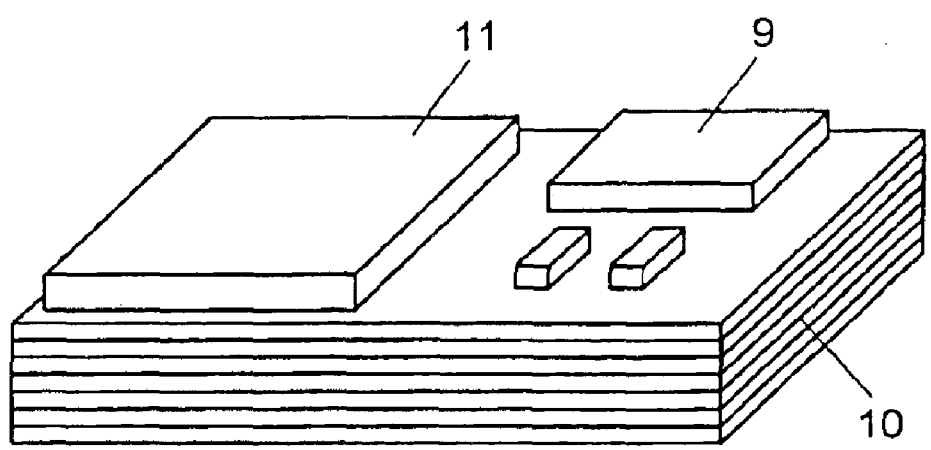
FIG. 2 is a perspective view of the high frequency switch in accordance with the first exemplary embodiment of the present invention.

More specifically, low-pass filter 8 configured with an LC circuit is connected to the side of transmission port 2 of the above high frequency switch, and reception filter 9 is connected to the side of reception port 4. FIG. 2 depicts this configuration. Low-pass filter 8 configured with the LC circuit is formed by an inner layer of dielectric multilayer board 10, and reception filter 9 Is mounted on this multilayer board 10. The high frequency switch shown in FIG. 1A is made by integrally forming two FET switches 3 and 6 by semiconductor element 11 and mounting this semiconductor element 11 on the top face of multilayer board 10. Remaining strip line 5 is formed in an inner layer of muitilayer board 10. These components are appropriately connected using connection electrodes such as via holes.

The above configuration, in which the high frequency switch is combined with low-pass filter 8 and reception filter 9, allows further downsizing and a higher degree of integration of other high frequency components by reducing the area required by high frequency components such as reception filter 9 and semiconductor element 11 mounted on the top face of multilayer board 10.

The phase shifter described above can also be configured only with a strip line whose electrical length is ¼ wavelength. However, a function of a notch circuit for attenuating a predetermined frequency band is added to the function of the phase shifter described above by coupling this phase shifter to the strip line connected in parallel to the capacitor.

Moreover, although it is not illustrated in particular, a function of a low-pass filter can also be added by grounding one end of this parallel unit via a grounding capacitor. This grounding capacitor can also be easily formed in the multilayer substrate, facilitating further combining with other high frequency components.

Figure 1B:
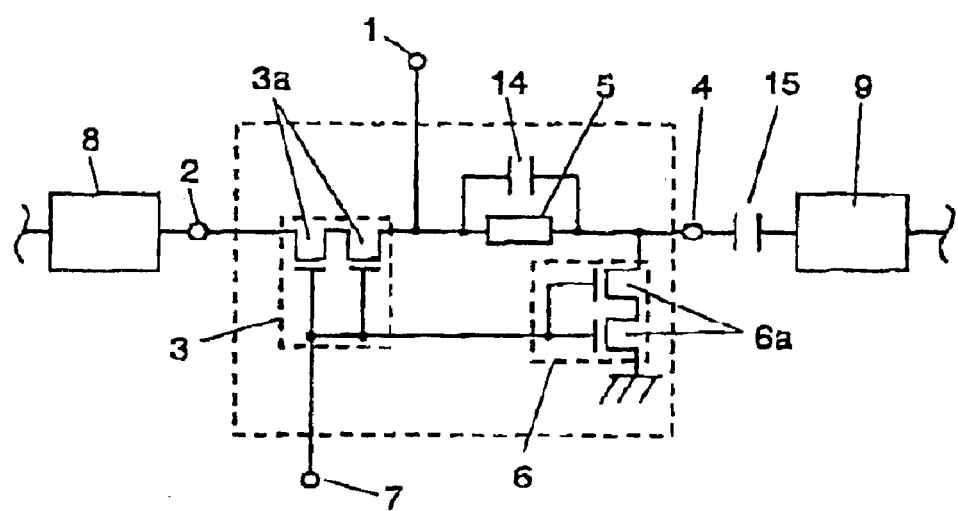

As shown in FIG. 1B, in reception filter 9 connected to reception port 4, via a capacitor 15, a path from reception port 4 to a later step is preferably made of a high frequency filter such as a band pass filter and SAW filter connected by capacitive coupling of a capacitor 15. This is because the capacitive coupling can also be used as a capacitor for cutting the DC component in the control voltage applied from control port 7.

In the above parallel unit of strip line 5 and capacitor 14, the resonance frequency which is determined by inductance of strip line 5 and capacitance of capacitor 14 can be set to an image band of a system. In this case, attenuation of the image band is increased between I/O port 1 and reception port 4 so as to cover a part of attenuation of the image band required in the system. This reduces load on reception filter 9, securing further flexibility in design. As a result, the reception filter with less loss can be configured.

At present, the SAW filter is mainly used as reception filter 9 connected after the high frequency switch circuit. Accordingly, it is preferable to employ the SAW filter as reception filter 9.

If the reception filter has a sharing device structure by combining two SAW filters, the high frequency signal output from reception port 4 can be further divided, further adding value to the high frequency switch.

Second Exemplary Embodiment

The high frequency switch described in the first exemplary embodiment refers to an SPDT-type high frequency switch circuit in which transmission port 2 and reception port 4 are generally switched as required against one I/O port 1.

Figure 3:
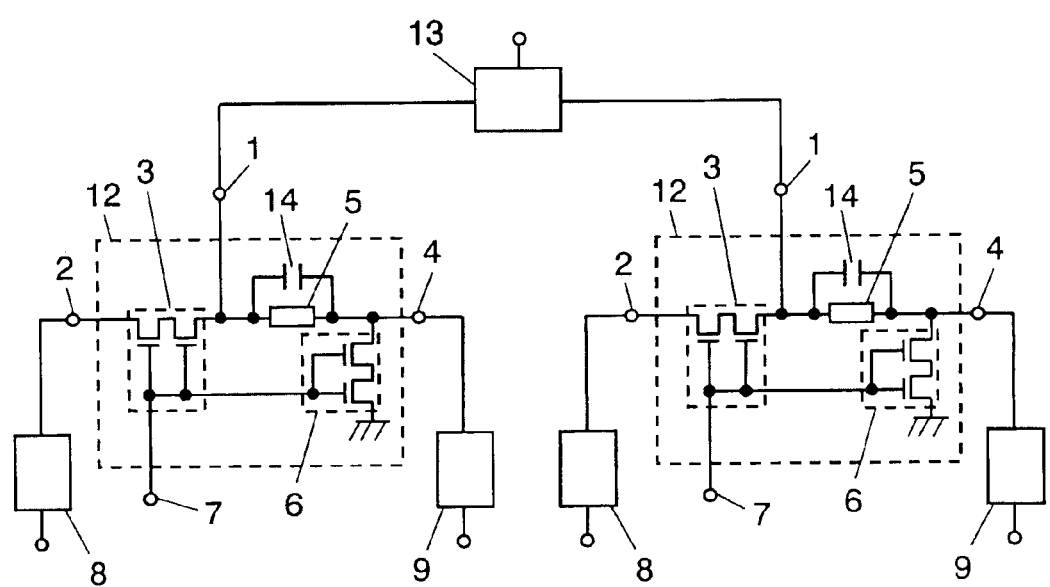
FIG. 3 is an equivalent circuit diagram of a high frequency switch in accordance with a second exemplary embodiment of the present invention.

FIG. 3 is a combined high frequency switch for multiple bands in which two or more types of transmission and receiving signals in different frequency bands are handled by connecting diplexer 13 to I/O port of two high frequency switches 12. In this case, the circuit configuration becomes more complex, and FET switches 3 and 6 and other chip components such as capacitors and inductors need to be densely mounted on the top face of multilayer board 10. The integration achieved by the present invention, as described, is thus extremely effective for saving mounting space on the top face of multilayer board 10.

In the present invention, a strip line is provided between the second FET switch whose one end is connected between the I/O port and reception port and the other end is grounded, and the I/O port. The strip line divides the voltage applied to each FET switch by providing the parallel unit of the strip line and capacitor having an electrical length equivalent to ¼ wavelength of the high frequency signal input to the transmission port. This enables reduction of the number of steps in each FET switch, and thus the present invention readily enables the downsizing of the high frequency switch, making it suitable for combining with other high frequency components.

What is claimed is:

1. A high frequency switch comprising:
    a first FET switch connected between an input and output (I/O) port and a transmission port;
    a second FET switch whose one end is connected between said I/O port and a reception port and the other end is ground;
    said first FET switch and said second FET switch being a two-step structure;
    a control port for controlling turning on and off of said first and second FET switches; and
    a parallel unit of a strip line and capacitor, said parallel unit connected between one end of said second FET switch and said I/O port, and having an electrical length equivalent to about ¼ wavelength of a high frequency signal input from said transmission port.

2. The high frequency switch as defined in claim 1, wherein at least one end of said strip line is ground via a capacitor.

3. The high frequency switch as defined in claim 1, further including a reception filter coupled to said reception port by a capacitor which creates a capacitive coupling.

4. The high frequency switch as defined in claim 3, wherein said reception filter is a SAW filter.

5. A high frequency switch comprising:
    a first FET switch connected between an input and output (I/O) port and transmission port;
    a second FET switch whose one end is connected between said I/O port and a reception port and the other end is ground;
    a control port for controlling turning on and off of said first FET switch and of said second FET switch; and
    a parallel unit of a strip line and capacitor, said parallel unit connected between one end of said second FET switch and said I/O port, and having an electrical length equivalent to about ¼ wavelength of a high frequency signal input from said transmission port and a resonance frequency of said parallel unit is set to an image band region of the system.

6. A high frequency switch comprising:
    a first FET switch connected between an input and output (I/O) port and transmission port;
    a parallel unit of a strip line and capacitor, said parallel unit connected between said I/O port and a reception port, and having an electrical length equivalent to ¼ wavelength of a high frequency signal input from said transmission port;
    a second FET switch whose one end is connected to said strip line to a side of said reception port and the other end is ground;
    said first FET switch and said second FET switch being a two-step structure; and
    a control port for controlling turning on and off of said first and second FET switches;
    wherein said parallel unit of the strip line and capacitor is formed in an inner layer of a dielectric multilayer board, and said first and second FET switches are mounted on a surface of said multilayer board as a high frequency device.

7. The high frequency switch as defined in claim 6, wherein at least one end of said parallel unit of said strip line and said capacitor is ground via a grounding capacitor, said grounding capacitor being formed in an inner layer of said multilayer board.

8. The high frequency switch as defined in claim 6, wherein a transmission filter configured with an LC is connected to an end of said transmission port, said transmission filter being formed in an inner layer of said multilayer board.

9. The high frequency switch as defined in claim 6, wherein a SAW filter is connected to an end of said reception port, said SAW filter being mounted on the surface of said multilayer board.

* * * * *